(12) United States Patent
Luo et al.

(10) Patent No.: US 11,581,339 B2
(45) Date of Patent: Feb. 14, 2023

(54) PIXEL STRUCTURE AND MANUFACTURING METHOD THEREFOR, ARRAY SUBSTRATE, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Hao Luo, Beijing (CN); Xiaojing Qi, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 200 days.

(21) Appl. No.: 16/641,346

(22) PCT Filed: Apr. 30, 2019

(86) PCT No.: PCT/CN2019/085176
§ 371 (c)(1),
(2) Date: Feb. 24, 2020

(87) PCT Pub. No.: WO2019/210850
PCT Pub. Date: Nov. 7, 2019

(65) Prior Publication Data
US 2020/0243567 A1 Jul. 30, 2020

(30) Foreign Application Priority Data
May 2, 2018 (CN) .......................... 201810410743.4

(51) Int. Cl.
*H01L 27/12* (2006.01)

(52) U.S. Cl.
CPC ........ *H01L 27/1222* (2013.01); *H01L 27/124* (2013.01); *H01L 27/1259* (2013.01)

(58) Field of Classification Search
CPC ............... H01L 27/1222; H01L 27/124; H01L 27/1248
See application file for complete search history.

(56) References Cited

U.S. PATENT DOCUMENTS 9,711,543 B2 * 7/2017 Won .................. G02F 1/134363
2011/0310341 A1 12/2011 Kim et al.
(Continued)

FOREIGN PATENT DOCUMENTS

CN 101963727 A 2/2011
CN 202093289 U 12/2011
(Continued)

*Primary Examiner* — Peter M Albrecht
(74) *Attorney, Agent, or Firm* — Dilworth & Barrese, LLP.; Michael J. Musella, Esq.

(57) ABSTRACT

A pixel structure and a manufacturing method therefor, an array substrate, and a display device are provided. The pixel structure includes a pixel electrode, an active layer, a source/drain electrode layer, and a common electrode which are located on a base substrate. The pixel electrode is located between the base substrate and the common electrode. The source/drain electrode layer includes a first electrode and a second electrode which are electrically connected to the active layer, and the second electrode is electrically connected to the pixel electrode. The active layer is located between the base substrate and the source/drain electrode layer. The active layer includes a first surface close to the source/drain electrode layer. The source/drain electrode layer includes a second surface close to the active layer. Partial edge of the first surface is aligned with partial edge of the second surface.

19 Claims, 7 Drawing Sheets

(56) References Cited

U.S. PATENT DOCUMENTS

2012/0086009 A1    4/2012  Shin et al.
2012/0133856 A1*  5/2012  Ono ................... G02F 1/13439
                                                    257/E33.012

FOREIGN PATENT DOCUMENTS

| | | | | |
|---|---|---|---|---|
| CN | 103474434 A | | 12/2013 | |
| CN | 107068691 A | * | 8/2017 | ........... H01L 27/124 |
| CN | 108594547 A | | 9/2018 | |
| JP | 2011133910 A | * | 7/2011 | |
| KR | 1020080049443 A | | 6/2008 | |
| KR | 20130067442 A | * | 6/2013 | ....... G02F 1/134309 |
| KR | 1020140991401 A | | 7/2014 | |

\* cited by examiner

PIXEL STRUCTURE AND MANUFACTURING METHOD THEREFOR, ARRAY SUBSTRATE, AND DISPLAY DEVICE

CROSS REFERENCE TO RELATED APPLICATION

The present application claims priority of Chinese patent application No. 201810410743.4 filed on May 2, 2018, the present disclosure of which is incorporated herein by reference in its entirety as part of the present disclosure.

TECHNICAL FIELD

Embodiments of the present disclosure relate to a pixel structure and a manufacturing method therefor, an array substrate and a display device.

BACKGROUND

With rapid development of display technology, liquid crystal display devices have been widely used in people's life.

The liquid crystal display device includes an array substrate and an opposite substrate which are opposite to each other, and a liquid crystal layer arranged between the array substrate and the opposite substrate. The liquid crystal display device includes a pixel electrode and a common electrode, and an electric field is generated to control deflection of liquid crystal molecules by applying a common voltage to the common electrode and applying a pixel voltage to the pixel electrode, so that the light in different pixel regions is controlled.

SUMMARY

Embodiments of the present disclosure relate to a pixel structure and a manufacturing method thereof, an array substrate and a display device, and the embodiments of the present disclosure reduce the manufacturing cost of the pixel structure and improve an aperture ratio of the pixel structure.

At least one embodiment of the present disclosure provides a pixel structure, and the pixel structure includes a base substrate, and a pixel electrode, an active layer, a source-drain electrode layer and a common electrode which are on the base substrate, the pixel electrode is located between the base substrate and the common electrode; the source-drain electrode layer includes a first electrode and a second electrode which are electrically connected with the active layer, and the second electrode is electrically connected with the pixel electrode; and the active layer is located between the base substrate and the source-drain electrode layer, the active layer includes a first surface close to the source-drain electrode layer, the source-drain electrode layer includes a second surface close to the active layer, and a portion of an edge of the first surface of the active layer is aligned with a portion of an edge of the second surface of the source-drain electrode layer.

For example, the pixel structure further includes a first insulating layer and a first connection pattern, the pixel electrode, the active layer and the source-drain electrode layer are located between a layer where the first insulating layer is located and the base substrate, the first insulating layer is provided with a first via hole and a second via hole therein, an orthographic projection of the first via hole on the base substrate overlaps an orthographic projection of the second electrode on the base substrate, and an orthographic projection of the second via hole on the base substrate overlaps an orthographic projection of the pixel electrode on the base substrate; the first connection pattern is located on the first insulating layer, and the second electrode is electrically connected with the pixel electrode by the first connection pattern through at least the first via hole and the second via hole.

For example, the pixel structure further includes a second insulating layer, the second insulating layer is located between the first insulating layer and the base substrate, and the second insulating layer covers the pixel electrode; the second insulating layer is provided therein with a third via hole communicated with the second via hole, and the second electrode is electrically connected with the pixel electrode by the first connection pattern through the first via hole, the second via hole and the third via hole.

For example, the pixel structure includes a common electrode layer, and the common electrode layer includes the first connection pattern and the common electrode.

For example, the pixel structure further includes a second connection pattern, the second connection pattern is located between the first insulating layer and the pixel electrode, and the first connection pattern is electrically connected with the pixel electrode by the second connection pattern.

For example, the pixel structure further includes a transistor, the transistor includes a gate electrode, the first electrode, the second electrode and the active layer, the pixel structure includes a gate electrode layer, and the gate electrode layer includes the second connection pattern and the gate electrode.

For example, in the pixel structure, the second connection pattern extends to be between the active layer and the base substrate.

For example, the pixel structure further includes a signal line, the signal line is located between the common electrode and the base substrate, and the common electrode overlaps the signal line.

At least one embodiment of the present disclosure further provides an array substrate, and the array substrate includes the pixel structure according to any one of the embodiments mentioned above.

At least one embodiment of the present disclosure further provides a display device, and the display device includes the array substrate according to the above embodiment.

At least one embodiment of the present disclosure further provides a manufacturing method of a pixel structure, and the manufacturing method includes: forming a common electrode on a base substrate and a pixel electrode between the base substrate and the common electrode; and forming a source-drain electrode layer and an active layer on the base substrate by using a gray-tone mask process so that the active layer is located between the base substrate and the source-drain electrode layer, the source-drain electrode layer includes a first electrode and a second electrode both electrically connected with the active layer, and the second electrode is electrically connected with the pixel electrode.

For example, the forming the source-drain electrode layer and the active layer on the base substrate by using the gray-tone mask process includes: sequentially forming an active material layer, a source-drain material layer and a first photoresist pattern on the base substrate; taking the first photoresist pattern as a mask to remove a portion which is included by the source-drain material layer and which is not covered by the first photoresist pattern to obtain a source-drain layer pattern, and removing a portion which is included by the active material layer and which is not covered by the first photoresist pattern to obtain the active layer; processing the first photoresist pattern to obtain a second photoresist pattern; and taking the second photoresist pattern as a mask to remove a portion which is included by the source-drain layer pattern and which is not covered by the second photoresist pattern to obtain the source-drain electrode layer including the first electrode and the second electrode.

For example, the manufacturing method further includes: forming a first insulating material layer covering the pixel electrode, the active layer and the source-drain electrode layer; patterning the first insulating material layer to form a first insulating layer, so that the first insulating layer is provided with a first via hole and a second via hole therein, an orthographic projection of the first via hole on the base substrate overlaps an orthographic projection of the second electrode on the base substrate, and an orthographic projection of the second via hole on the base substrate overlaps an orthographic projection of the pixel electrode on the base substrate; and forming a first connection pattern on the first insulating layer, so that the second electrode is electrically connected with the pixel electrode by the first connection pattern through at least the first via hole and the second via hole.

For example, the manufacturing method further includes: before forming the first insulating material layer, forming a second insulating material layer covering the pixel electrode on the base substrate; further forming a second insulating layer in patterning the first insulating material layer, so that the second insulating layer is provided therein with a third via hole communicated with the second via hole, and the second electrode is electrically connected with the pixel electrode by the first connection pattern through the first via hole, the second via hole and the third via hole.

For example, the manufacturing method further includes: forming a common electrode material layer on the first insulating layer; and patterning the common electrode material layer to form the common electrode and the first connection pattern.

For example, the manufacturing method further includes: after forming the pixel electrode and before forming the first insulating layer, forming a gate electrode material layer; and patterning the gate electrode material layer to form a gate electrode and a second connection pattern, so that the first connection pattern is electrically connected with the pixel electrode by the second connection pattern.

For example, in the manufacturing method, the second connection pattern extends to be between the active layer and the base substrate.

For example, the method includes: forming the pixel electrode by using a pixel electrode mask plate; forming a gate electrode layer including a gate electrode by using a gate mask plate; after forming the pixel electrode and the gate electrode layer, forming the active layer and the source-drain electrode layer by using a source-drain layer mask plate; forming a first insulating material layer and a second insulating material layer between the first insulating material layer and the base substrate, and patterning the first insulating material layer and the second insulating material layer by using an insulating layer mask plate to form a first insulating layer including a first via hole and a second via hole and a second insulating layer including a third via hole, so that the second insulating layer is located between the active layer and the gate electrode layer, and the first insulating layer is located between the source-drain electrode layer and the common electrode; and after forming the first insulating layer and the second insulating layer, forming a common electrode layer including a first connection pattern and the common electrode by using a common electrode mask plate, so that the first connection pattern is electrically connected with the second electrode through the first via hole, and the first connection pattern is electrically connected with the pixel electrode through the second via hole and the third via hole.

For example, the gate electrode layer further includes a second connection pattern spaced apart from the gate electrode, the second connection pattern is located on a side of the pixel electrode away from the base substrate, and the second connection pattern is electrically connected with the pixel electrode and the first connection pattern.

For example, the manufacturing method further includes forming a signal line, the signal line is located between the common electrode and the base substrate, and the common electrode overlaps the signal line.

At least one embodiment of the present disclosure further provides a pixel structure, and the pixel structure includes: a base substrate, and a gate electrode layer, a pixel electrode, an active layer, a source-drain electrode layer and a common electrode layer which are on the base substrate; the pixel electrode is located between the base substrate and the common electrode layer; the source-drain electrode layer includes a first electrode and a second electrode which are electrically connected with the active layer; the common electrode layer includes a common electrode and a first connection pattern disconnected from the common electrode, the first connection pattern is located on a side of the second electrode away from the base substrate, and the first connection pattern is electrically connected with the second electrode; the gate electrode layer includes a gate electrode and a second connection pattern disconnected from the gate electrode, the second connection pattern is located between the first connection pattern and the pixel electrode, and the second connection pattern is electrically connected with the first connection pattern and the pixel electrode.

For example, the second connection pattern is in direct contact with the pixel electrode.

For example, an orthographic projection of the second connection pattern on the base substrate is located in an orthographic projection of the pixel electrode on the base substrate.

For example, the orthographic projection of the second connection pattern on the base substrate is outside the orthographic projection of the common electrode on the base substrate.

For example, the orthographic projection of the second connection pattern on the base substrate overlaps the orthographic projection of the active layer on the base substrate.

For example, the pixel structure further includes a first insulating layer and a second insulating layer between the first insulating layer and the base substrate; the pixel electrode, the active layer and the source-drain electrode layer are located between a layer where the first insulating layer is located and the base substrate, the first insulating layer is provided with a first via hole and a second via hole therein, an orthographic projection of the first via hole on the base substrate overlaps an orthographic projection of the second electrode on the base substrate, and an orthographic projection of the second via hole on the base substrate overlaps the orthographic projection of the pixel electrode on the base substrate; the second insulating layer is provided therein with a third via hole communicated with the second via hole; the first connection pattern is located on a side of the first insulating layer away from the base substrate, the first connection pattern is electrically connected with the second electrode through the first via hole, and the first connection pattern is electrically connected with the second connection pattern through the second via hole and the third via hole.

For example, the pixel structure further includes a signal line, the signal line is located between the common electrode and the base substrate, and an orthographic projection of the common electrode on the base substrate overlaps an orthographic projection of the signal line on the base substrate.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

Figure 1A:
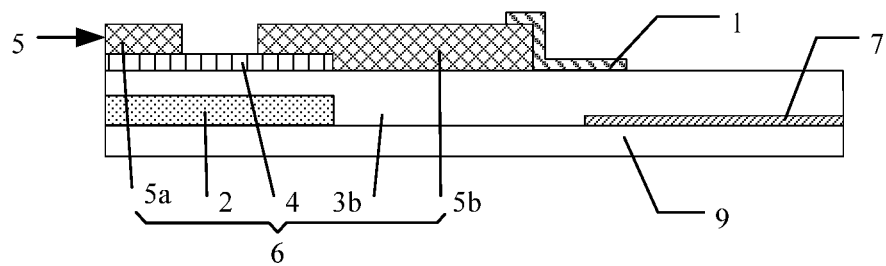
FIG. 1A is a sectional schematic diagram of a pixel structure.

FIG. 1A is a sectional schematic diagram of a pixel structure. As illustrated in FIG. 1A, the pixel structure includes a common electrode 7, a transistor 6 and a pixel electrode 1 which are on a base substrate 9, the transistor 6 includes a gate electrode 2, a gate insulating layer 3b, an active layer 4, a source electrode 5a and a drain electrode 5b, and the source electrode 5a and the drain electrode 5b are located in a source-drain metal layer 5.

For example, the manufacturing method of the pixel structure illustrated in FIG. 1A includes the following steps S11 to S16.

Step S11: using a first mask plate to form the common electrode 7.

Step S12: using a second mask plate to form a gate metal layer including the gate electrode 2 and a gate line.

Step S13: using a third mask plate to form the gate insulating layer 3b covering the gate metal layer. In this step, a via hole (not illustrated in FIG. 1A) is formed in the gate insulating layer 3b, and the via hole exposes a portion of a surface of the gate line, so that the gate line is electrically connected with other conductive component through the via hole.

Step S14: using a fourth mask plate to form the active layer 4 on the gate insulating layer 3b.

Step S15: using a fifth mask plate to form the source-drain metal layer 5 on the active layer 4, so that the source-drain metal layer 5 includes a data line, and the source electrode 5a and the drain electrode 5b both electrically connected with the active layer 4.

Step S16: using a sixth mask plate to form the pixel electrode 1 overlapped and connected with the drain electrode 5b and provided on the gate insulating layer 3b.

In the study, inventors of the present disclosure noticed that manufacturing the pixel structure illustrated in FIG. 1A requires six mask plates, which results in a higher manufacturing cost of the pixel structure.

Figure 1B:
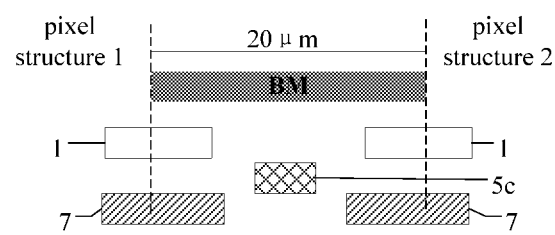
FIG. 1B is a schematic diagram of adjacent pixel structures illustrated in FIG. 1A and located near a position of a data line.

The inventors of the present disclosure further noticed that in a display device including a plurality of the pixel structures as illustrated in FIG. 1A, a black matrix BM between adjacent pixel structures is wide, so that an aperture ratio is low. For example, as illustrated in FIG. 1B, a pixel structure 1 and a pixel structure 2 adjacent to each other are located at two sides of the data line 5c. A distance between the pixel structure 1 and the pixel structure 2 is not less than 12 µm to avoid mutual interference between the pixel structure 1 and the pixel structure 2. Furthermore, for each of the pixel structures, as illustrated in FIG. 1B, the pixel electrode 1 is located above the common electrode 7, and a portion of the pixel electrode 1 close to the data line 5c is an ineffective region (with reference to a region between the data line 5c and each dotted line in FIG. 1B) that does not contribute to an electric field for controlling liquid crystal, and therefore, the width of the black matrix BM is equal to at least the distance between the pixel structures plus the widths of the ineffective regions of the two pixel electrodes. For example, the width of the black matrix BM near the data line 5c is not less than 20 µm. Similarly, the width of the black matrix near the gate line is also wide.

The embodiments of the present disclosure provide a pixel structure and a manufacturing method thereof, an array substrate and a display device. The pixel structure includes a base substrate, and a pixel electrode, an active layer, a source-drain electrode layer and a common electrode which are on the base substrate, the pixel electrode is located between the base substrate and the common electrode; the source-drain electrode layer includes a first electrode and a second electrode which are electrically connected with the active layer, and the second electrode is electrically connected with the pixel electrode; and the active layer is located between the base substrate and the source-drain electrode layer, the active layer includes a first surface close to the source-drain electrode layer, the source-drain electrode layer includes a second surface close to the active layer, and a portion of an edge of the first surface of the active layer is aligned with a portion of an edge of the second surface of the source-drain electrode layer. The embodiments of the present disclosure reduce the manufacturing cost of the pixel structure and increase the aperture ratio of the pixel structure.

It should be noted that, the active layer and the source-drain electrode layer are formed by a patterning process using a same mask plate (such as a halftone mask plate). Due to process reasons, the edge of the surface of the active layer and the edge of the surface of the source-drain electrode layer which are close to each other (that is the first surface and the second surface) may not be perfectly aligned. Therefore, the "aligned" mentioned in the embodiments of the present disclosure refers to approximate alignment within an allowable process error range. The allowable process error is determined according to a specific patterning process, description of which is omitted herein.

The embodiments of the present disclosure are described in detail below with reference to the drawings.

Figure 2A:
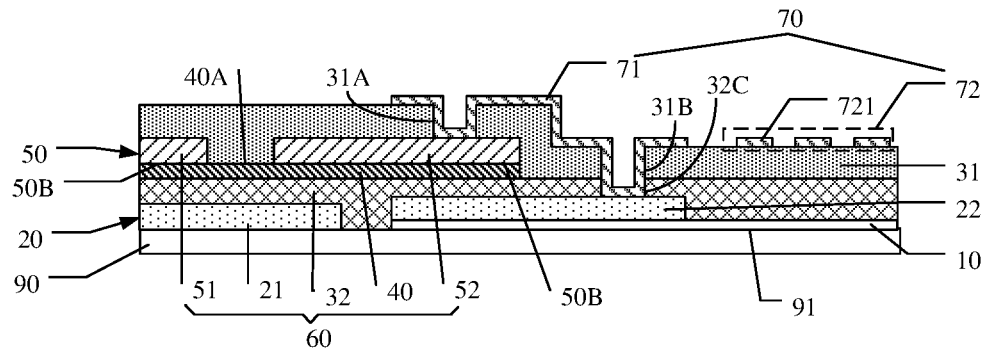
FIG. 2A is a sectional schematic diagram of a pixel structure provided by at least one embodiment of the present disclosure.
Figure 2B:
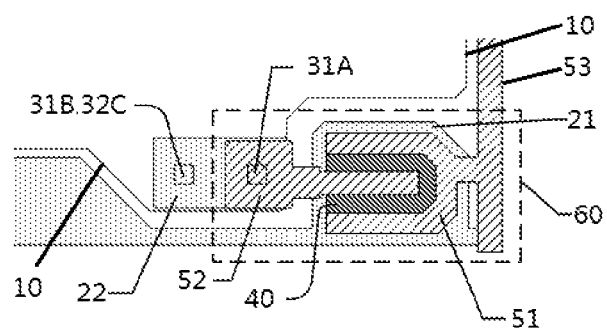
FIG. 2B is a first schematic top view of a portion of the pixel structure provided by at least one embodiment of the present disclosure.
Figure 2C:
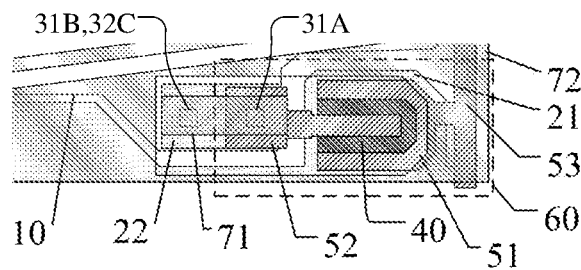
FIG. 2C is a second schematic top view of a portion of the pixel structure provided by at least one embodiment of the present disclosure.

At least one embodiment of the present disclosure provides a pixel structure, as illustrated in FIG. 2A to FIG. 2C, the pixel structure includes a base substrate 90, and a transistor 60, a pixel electrode 10, a first insulating layer 31 and a common electrode 72 which are on a surface 91 of the base substrate 90; the transistor 60 includes a gate electrode 21, a second insulating layer 32, an active layer 40, a first electrode 51 and a second electrode 52.

Both the first electrode 51 and the second electrode 52 are located in the source-drain electrode layer 50, one of the first electrode 51 and the second electrode 52 is a source electrode, the other one of the first electrode 51 and the second electrode 52 is a drain electrode, and the second electrode 52 is electrically connected with the pixel electrode 10. For example, in a case that the second electrode 52 is electrically connected with the pixel electrode 10, the second electrode 52 is the drain electrode, and accordingly, the first electrode 51 is the source electrode.

The active layer 40 is electrically connected with both the first electrode 51 and the second electrode 52, and the active layer 40 includes a channel region between the first electrode 51 and the second electrode 52 (that is, the active layer 40 includes a source electrode region electrically connected with the source electrode, a drain electrode region electrically connected with the drain electrode, and a channel region between the source electrode region and the drain electrode region). For example, as illustrated in FIG. 2B and FIG. 2C, the active layer 40 has a U-shaped channel region; in other embodiments, a shape of the channel region is linear, T-shaped, or L-shaped or is of other shapes.

In a direction perpendicular to the surface 91 of the base substrate 90, the active layer 40 is located between the base substrate 90 and the source-drain electrode layer 50, and in this case, the active layer 40 and the source-drain electrode layer 50 are manufactured by the gray-tone mask process (for example, a halftone mask process) to reduce the production cost of the pixel structure and increase the productivity. In a case where the active layer 40 and the source-drain electrode layer 50 are manufactured by the gray-tone mask process, portions of the edges of the surfaces which respectively belongs to the source-drain electrode layer 50 and the active layer 40 and which are adjacent to each other are substantially aligned. For example, as illustrated in FIG. 2A, the active layer 40 includes a first surface 40A close to the source-drain electrode layer 50, and the source-drain electrode layer 50 includes a second surface 50B close to the active layer 40, that is to say, the first surface 40A is adjacent to the second surface 50B; a portion of the edge of the first surface 40A of the active layer 40 is substantially aligned with a portion of the edge of the second surface 50B of the source-drain electrode layer 50 (as illustrated in FIG. 2B and FIG. 2C, an orthographic projection of the portion of the edge of the first surface 40A of the active layer 40 on the base substrate approximately coincides with an orthographic projection of the portion of the edge of the second surface 50B of the source-drain electrode layer 50 on the base substrate (not illustrated in FIG. 2B)).

As illustrated in FIG. 2A, the pixel electrode 10 and the common electrode 72 are located on opposite sides of the first insulating layer 31 respectively; in a direction perpendicular to the surface 91 of the base substrate 90, the pixel electrode 10 is located between the base substrate 90 and the common electrode 72. In the embodiments of the present disclosure, because the pixel electrode 10 is located below the common electrode 72, for the adjacent pixel structures, a distance between the pixel electrodes 10 is small, and the ineffective region of each of the pixel electrodes is relatively small, so that the aperture ratio is increased.

Because the pixel electrode 10 is located below the common electrode 72, in order to form an electric field that controls the deflection of liquid crystal molecules, for example, as illustrated in FIG. 2A, the pixel electrode 10 is in a shape of a plate, and the common electrode 72 includes a plurality of common sub-electrodes 721 spaced apart from each other.

For example, as illustrated in FIG. 2B and FIG. 2C, the pixel structure provided by at least one embodiment of the present disclosure further includes a signal line 53; in the direction perpendicular to the surface 91 of the base substrate 90, the signal line 53 is located between the common electrode 72 and the base substrate 90; as illustrated in FIG. 2C, the common electrode 72 overlaps the signal line 53, that is, an orthographic projection of the common electrode 72 on the base substrate 90 overlaps an orthographic projection of the signal line 53 on the base substrate 90. In the embodiment of the present disclosure, because the common electrode 72 is located above the signal line 53 and overlaps the signal line 53, the common electrode 72 plays a role of shielding the signal of the signal line 53, so that the size of the effective region of the common electrode 72 (that is, a size of a portion which is included by the common electrode 72 and which is located in an opening region (that is a display region) of the pixel structure) is able to be made larger, which is conducive to improving the aperture ratio and reducing power consumption.

For example, the signal line 53 is a data line, which is electrically connected with the first electrode 51 of the thin film transistor 60 (for example, the data line is directly and electrically connected with the first electrode 51, that is, the source-drain electrode layer includes the data line, the first electrode 51 and the second electrode 52), as illustrated in FIG. 2B and FIG. 2C. In other embodiments, the signal line 53 is a gate line, which is directly connected with the gate electrode, for example, the gate electrode layer includes the gate line and the gate electrode.

The inventors of the present disclosure noticed that, for the pixel structure as illustrated in FIG. 1A, because the pixel electrode 1 which overlaps and directly connects the drain electrode 5b is formed after the source-drain metal layer 5 is formed, the phenomenon that an etching solution corrodes the source-drain metal layer 5 is prone to occur in the process of etching a pixel electrode material to form the pixel electrode 1. In addition, because the pixel electrode 1 is formed after the active layer 4 is formed, in the process of depositing the pixel electrode material by sputtering, the pixel electrode material is also formed in the channel region of the active layer 4 between the source electrode 5a and the drain electrode 5b. The pixel electrode material in the channel region is difficult to be completely removed during the etching process of forming the pixel electrode 1, which easily causes a characteristic curve of the transistor 6 to change.

For example, in at least one embodiment of the present disclosure, as illustrated in FIG. 2A, the first insulating layer 31 covers the active layer 40 and the source-drain electrode layer 50, and the first insulating layer 31 is in direct contact with the channel region of the active layer 40 and the source-drain electrode layer 50. In a case where the common electrode 72 is located above the active layer 40, by allowing the first insulating layer 31 to be in direct contact with the channel region of the active layer 40 and the source-drain electrode layer 50, it is beneficial to avoid the phenomenon that a material for forming the common electrode 72 is in direct contact with a material for forming the active layer in the channel region to affect the characteristic curve of the transistor 60 and to prevent the etching solution from corroding the source-drain electrode layer 50.

For example, in order to further prevent the source-drain electrode layer 50 from being corroded and/or to prevent the change of the characteristic curve of the transistor 60 caused due to that a material of the pixel electrode 10 is in direct contact with the material for forming the active layer in the channel region of the transistor 60, the active layer 40 and the source-drain electrode layer 50 are formed after the pixel electrode 10 is formed. In this case, for example, the pixel electrode 10 is located between the active layer 40 and the base substrate 90 in the direction perpendicular to the surface 91 of the base substrate 90.

For example, in a case that the pixel electrode 10 is located between the active layer 40 and the base substrate 90, the pixel electrode 10 is electrically connected with the second electrode 52 by a connection pattern.

For example, as illustrated in FIG. 2A and FIG. 2C, the first insulating layer 31 covers the pixel electrode 10, the active layer 40 and the source-drain electrode layer 50, and the first insulating layer 31 is provided with a first via hole 31A corresponding to the second electrode 52 (that is, an orthographic projection of the first via hole 31A on the base substrate 90 overlaps an orthographic projection of the second electrode 52 on the base substrate 90) and a second via hole 31B corresponding to the pixel electrode 10 (that is, an orthographic projection of the second via hole 31B on the base substrate 90 overlaps an orthographic projection of the pixel electrode 10 on the base substrate 90); the pixel structure further includes a first connection pattern 71 located on the first insulating layer 31, and the second electrode 52 is electrically connected with the pixel electrode 10 by the first connection pattern 71 through at least the first via hole 31A and the second via hole 31B, that is, the first connection pattern 71 includes a first portion located in the first via hole 31A and electrically connected with the second electrode 52 and includes a second portion located in the second via hole 31B and electrically connected with the pixel electrode 10, the first connection pattern 71 further includes a third portion which is located outside the first via hole 31A and the second via hole 31B and which covers the first insulating layer 31, and the first portion is electrically connected with the second portion by the third portion.

For example, a second insulating layer 32 is further provided between the first insulating layer 31 and the pixel electrode 10, that is, the second insulating layer 32 is located between the first insulating layer 31 and the base substrate 90 and covers the pixel electrode 10; the second insulating layer 32 is provided with a third via hole 32C communicating with the second via hole 31B (that is, the third via hole 32C corresponds to the second via hole 31B, in this case, an orthographic projection of the third via hole 32C on the base substrate 90 overlaps the orthographic projection of the second via hole 31B on the base substrate 90), the second electrode 52 is electrically connected with the pixel electrode 10 by the first connection pattern 71 through the first via hole 31A, the second via hole 31B and the third via hole 32C. In this case, the second portion of the first connection pattern 71 located in the second via hole 31B also extends into the third via hole 32C. In the embodiments of the present disclosure, in a case where the common electrode 72 is located on the first insulating layer 31, the first insulating layer 31 and the second insulating layer 32 are provided between the pixel electrode 10 and the common electrode 72; compared with the pixel structure as illustrated in FIG. 1A, a storage capacitance between the common electrode 72 and the pixel electrode 10 in the embodiments of the present disclosure is small.

For example, the second insulating layer 32 is a gate insulating layer located between the gate electrode 21 and the active layer 40. For example, the second insulating layer 32 is adjacent to both the gate electrode 21 and the active layer 40. In other embodiments, the second insulating layer 32 is an insulating layer adjacent to other components.

For example, in a case where the common electrode 72 is located on the first insulating layer 31, the first connection pattern 71 and the common electrode 72 are located in a same layer and made of a same material, that is, a common electrode layer 70 includes the first connection pattern 71 and the common electrode 72, as illustrated in FIG. 2A. In this case, the first connection pattern 71 and the common electrode 72 are formed by patterning a same film by using a same mask plate to simplify the manufacturing process.

For example, both the first connection pattern 71 and the common electrode 72 are made of a transparent conductive material. For example, the transparent conductive material is ITO (indium tin oxide), IZO (indium zinc oxide), or IGZO (indium gallium zinc oxide) or the like.

In the case where both the first connection pattern 71 and the common electrode 72 are made of the transparent conductive material, the first connection pattern 71 has a large resistance at the second via hole 31B. In order to reduce the resistance of the first connection pattern 71 at the second via hole 31B, for example, as illustrated in FIG. 2A, the pixel structure provided by at least one embodiment of the present disclosure further includes a second connection pattern 22, the second connection pattern 22 is located between the first insulating layer 31 and the pixel electrode 10, and the first connection pattern 71 is electrically connected with the pixel electrode 10 by the second connection pattern 22 (for example, the second connection pattern 22 directly and electrically connects the first connection pattern 71 with the pixel electrode 10). That is, the second connection pattern 22 is electrically connected with the second portion of the first connection pattern 71 in the second via hole 31B and is electrically connected with the pixel electrode 10 to electrically connect the first connection pattern 71 with the pixel electrode 10.

For example, as illustrated in FIG. 2A, the second connection pattern 22 overlaps the active layer 40. Because the second connection pattern 22 extends below the active layer 40, that is, the second connection pattern 22 extends to be between the active layer 40 and the base substrate 90, which not only increases the size of the second connection pattern 22 to further reduce the resistance, but also avoids the phenomenon that the second connection pattern 22 affects the aperture ratio.

For example, the second connection pattern 22 is made of a metal material. For example, the metal material is aluminum, aluminum alloy, copper, copper alloy, titanium, titanium alloy, molybdenum, or molybdenum-niobium alloy or the like metal.

For example, the second connection pattern 22 and the gate electrode 21 of the thin film transistor 60 are located in a same layer and are made of a same material, that is, a gate electrode layer (for example, a gate metal layer) 20 includes the second connection pattern 22 and the gate electrode 21, as illustrated in FIG. 2A. In this case, for example, a same mask plate is used to pattern a same thin film to form the second connection pattern 22 and the gate electrode 21 of the thin film transistor 60, thereby the manufacturing process is simplified.

For example, as illustrated in FIG. 2A, the pixel electrode 10 is located between the second connection pattern 22 and the base substrate 90 in the direction perpendicular to the surface 91 of the base substrate 90. That is, the second connection pattern 22 is formed after the pixel electrode 10 is formed, which is helpful to make the size of the pixel electrode 10 larger, and prevent the etching solution from corroding the second connection pattern 22 in the process of etching the pixel electrode material to form the pixel electrode 10.

For example, the first insulating layer 31 and the second insulating layer 32 are made by a same mask plate. For example, in this case, the second via hole 31B and the third via hole 32C are obtained by using the same mask in an etching process or the third via hole 32C is obtained by using the second via hole 31B as a mask to perform etching, which makes that the edge of the second via hole 31B and the edge of the third via hole 32C which are adjacent to each other are substantially aligned, as illustrated in FIG. 2A to FIG. 2C.

In the embodiments of the present disclosure, for example, the material of each of the first insulating layer 31 and the second insulating layer 32 is an inorganic insulating layer, an organic insulating layer, or a laminated structure of the inorganic insulating layer and the organic insulating layer. For example, the material of each of the gate electrode 21, the first electrode 51 and the second electrode 52 is a conductive material such as a metal (such as aluminum, aluminum alloy, copper, copper alloy, titanium, titanium alloy, molybdenum or molybdenum-niobium alloy or the like) or a conductive plastic or the like. For example, the material of the active layer 40 is amorphous silicon, polysilicon, or a metal oxide semiconductor material or the like. For example, each of the pixel electrode 10 and the common electrode 72 is made of a transparent conductive material, such as ITO (indium tin oxide), IZO (indium zinc oxide) or IGZO (indium gallium zinc oxide), or the like.

At least one embodiment of the present disclosure further provides an array substrate, and the array substrate includes the pixel structure according to any one of the embodiments mentioned above. For example, in the array substrate, a plurality of pixel structures are arranged in rows and columns to form an array structure.

At least one embodiment of the present disclosure further provides a display device, and the display device includes the array substrate according to the above embodiment.

Figure 3:
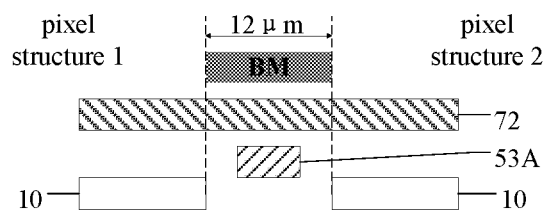
FIG. 3 is a schematic diagram of adjacent pixel structures close to a data line in a display device provided by at least one embodiment of the present disclosure.

For example, as illustrated in FIG. 3, in the display device, the common electrode 72 is located on an upper side of the signal line (for example, the data line 53A) and overlaps the signal line, so that the common electrode 72 plays a role of shielding the signal of the signal line. In this case, a width of the black matrix BM between the adjacent pixel structure 1 and the pixel structure 2 is made smaller, for example, the width of the black matrix BM is approximately equal to a distance of adjacent edges which respectively belong to the adjacent pixel electrodes 10. For example, the width of the black matrix BM is 12 μm.

Figure 4:
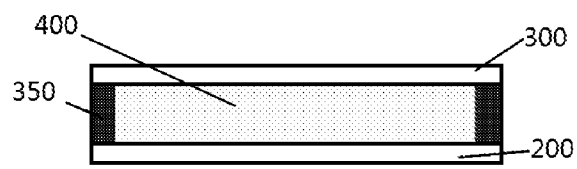
FIG. 4 is a structural schematic diagram of the display device provided by at least one embodiment of the present disclosure.

For example, as illustrated in FIG. 4, the display device according to the embodiments of the present disclosure includes the array substrate 200 and an opposite substrate 300. The array substrate 200 and the opposite substrate 300 are opposite to each other, the array substrate 200 is connected with the opposite substrate 300 by a frame sealant 350 to form a liquid crystal cell, and the liquid crystal cell is filled with liquid crystal material 400.

For example, the display device provided in the embodiments of the present disclosure is any product or component having a display function, such as a liquid crystal panel, a mobile phone, a tablet computer, a television, a display, a notebook computer, a digital photo frame, a navigator, and so on.

At least one embodiment of the present disclosure further provides a manufacturing method for a pixel structure, taking the pixel structure as illustrated in FIG. 2A to FIG. 2C as an example, the manufacturing method includes: forming the common electrode 72 on the base substrate 90, and forming the pixel electrode 10 between the base substrate 90 and the common electrode 72; and forming the source-drain electrode layer 50 and the active layer 40 on the base substrate 90 by using a gray-tone mask process. In the manufacturing method, the active layer 40 is located between the base substrate 90 and the source-drain electrode layer 50, the source-drain electrode layer 50 includes the first electrode 51 and the second electrode 52 which are electrically connected with the active layer 40, and the second electrode 52 is electrically connected with the pixel electrode 10.

For example, as illustrated in FIG. 5A to FIG. 5D, the forming the source-drain electrode layer 50 and the active layer 40 on the substrate 90 by using the gray-tone mask process includes the following step S51 to step S54.

Figure 5A:
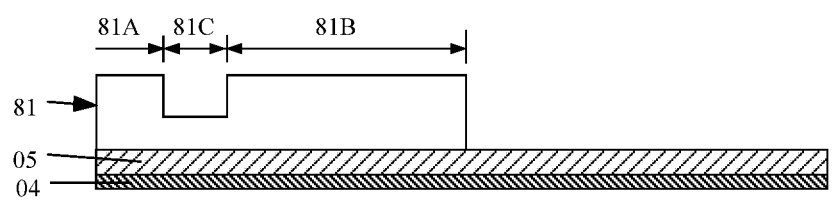
FIG. 5A to FIG. 5D are schematic diagrams of forming an active layer and a source-drain electrode layer by using a gray-tone mask process in a manufacturing method for the pixel structure provided by at least one embodiment of the present disclosure.

Step S51: as illustrated in FIG. 5A, an active material layer 04, a source-drain material layer 05 and a first photoresist pattern 81 are formed on the base substrate (not illustrated in FIG. 5A) in sequence, the first photoresist pattern 81 includes a first portion 81A, a second portion 81B and a thinned portion 81C which is located between the first portion 81A and the second portion 81B, and a thickness of the thinned portion 81C is less than each of a thickness of the first portion 81A and a thickness of the second portion 81B.

In this step S51, for example, the manufacturing step of the first photoresist pattern 81 includes: exposing a photoresist material by using a gray-tone mask plate (for example, a halftone mask plate), then developing the photoresist material after the photoresist material is exposed. Because the gray-tone mask plate includes three regions with different light transmittance, the photoresist material after being exposed includes three regions with different exposure degrees, a region with a largest exposure degree is completely removed by the development processing, a region with a smallest exposure degree is developed to obtain the first portion 81A and the second portion 81B of the first photoresist pattern 81, and a region with a middle exposure degree is developed to obtain the thinned portion 81C.

Figure 5B:
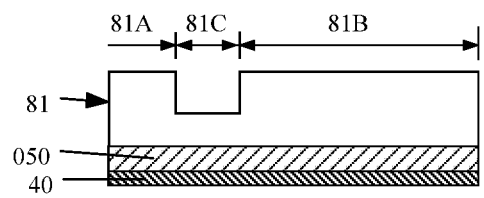

Step S52: taking the first photoresist pattern 81 as a mask to remove a portion which is included by the source-drain material layer 05 and which is not covered by the first photoresist pattern 81 to obtain a source-drain layer pattern 050, as illustrated in FIG. 5B; and using the first photoresist pattern 81 as a mask or using the source-drain layer pattern 050 as a mask to remove a portion which is included by the active material layer 04 and which is not covered by the first photoresist pattern 81 to obtain the active layer 40, as illustrated in FIG. 5B.

In the step S52, because both the active material layer 04 and the source-drain material layer 05 are etched with the first photoresist pattern 81 as the mask or the active material layer 04 is etched with the source-drain layer pattern 050 as the mask, therefore, the edge of the obtained active layer 40 and the edge of the obtained source-drain layer pattern 050 which are adjacent to each other are substantially aligned, that is, orthographic projections of the adjacent edges on the base substrate are substantially coincident with each other.

Figure 5C:
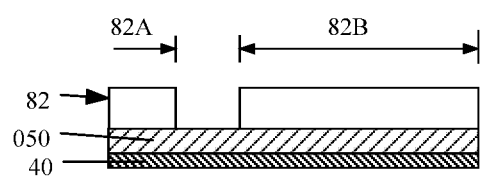

Step S53: the first photoresist pattern 81 is processed (for example, the first photoresist pattern 81 is ashed) to remove the thinned portion 81C of the first photoresist pattern 81, so that a second photoresist pattern 82 is obtained, as illustrated in FIG. 5C.

In the step S53, the second photoresist pattern 82 includes a first portion 82A and a second portion 82A which are spaced apart from each other, a region covered by the first portion 82A is consistent with a region covered by the first portion 81A of the first photoresist pattern 81, and a region covered by the second portion 82B is consistent with the region covered by the second portion 81B of the first photoresist pattern 81.

Figure 5D:
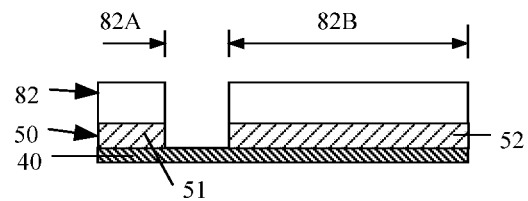

Step S54: taking the second photoresist pattern 82 as a mask, a portion which is included by the source-drain layer pattern 050 and which is not covered by the second photoresist pattern 82 is removed, so that the source-drain electrode layer 50 including the first electrode 51 and the second electrode 52 is obtained, as illustrated in FIG. 5D.

After completing the step S51 to the step S54, the active layer 40 and the source-drain electrode layer 50 are obtained; after that, the second photoresist pattern 82 is removed.

For example, as illustrated in FIG. 2A to FIG. 2C, the pixel structure further includes the first connection pattern 71, and the second electrode 52 of the thin film transistor 60 is electrically connected with the pixel electrode 10 by the first connection pattern 71. In this case, for example, the manufacturing method provided by at least one embodiment of the present disclosure further includes: forming a first insulating material layer covering the pixel electrode 10, the active layer 40 and the source-drain electrode layer 50; patterning the first insulating material layer to form the first insulating layer 31, so that the first via hole 31A corresponding to the second electrode 52 and the second via hole 31B corresponding to the pixel electrode 10 are formed in the first insulating layer 31; and forming the first connection pattern 71 on the first insulating layer 31, so that the second electrode 52 is electrically connected with the pixel electrode 10 by the first connection pattern 71 at least through the first via hole 31A and the second via hole 31B.

For example, in a case that the second insulating layer 32 is further provided between the first insulating layer 31 and the pixel electrode 10, the manufacturing method provided by at least one embodiment of the present disclosure further includes: before forming the first insulating material layer, forming a second insulating material layer covering the pixel electrode 10 on the base substrate 90; forming the second insulating layer 32 in the process of patterning the second insulating material layer, so that the second insulating layer is provided with the third via hole 32C corresponding to the second via hole 31B, and the second electrode 52 is electrically connected with the pixel electrode 10 by the first connection pattern 71 through the first via hole 31A, the second via hole 31B and the third via hole 32C.

It should be noted that, a component A corresponding to a component B refers to that an orthographic projection of the component A on the base substrate 90 overlaps an orthographic projection of the component B on the base substrate 90.

For example, in the manufacturing method provided by at least one embodiment of the present disclosure, the first connection pattern 71 is manufactured by the following step S61 and step S62.

Figure 6:
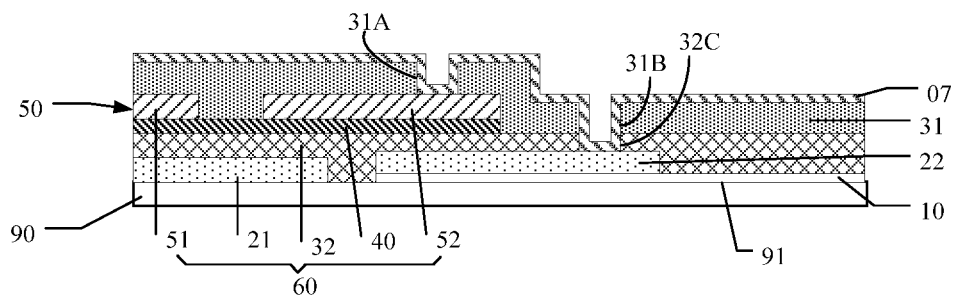
FIG. 6 is a schematic diagram of forming a common electrode material layer in the manufacturing method for the pixel structure provided by at least one embodiment of the present disclosure.

Step S61: forming a common electrode material layer 07 on the first insulating layer 31, as illustrated in FIG. 6.

Step S62: patterning the common electrode material layer 07 to form the common electrode 72 and the first connection pattern 71 spaced apart from each other, as illustrated in FIG. 2A and FIG. 2C.

In the step S62, for example, the patterning process includes: forming a photoresist material on the common electrode material layer 07; exposing the photoresist material by using a mask plate; developing the photoresist material after exposure to obtain a photoresist pattern; then etching the common electrode material layer 07 by using the photoresist pattern as a mask, so that the first connection pattern 71 and the common electrode 72 are obtained by the etching process.

For example, in the manufacturing method provided by at least one embodiment of the present disclosure, the first via hole 31A, the second via hole 31B and the third via hole 32C are manufactured by the following step S71 and step S72.

Figure 7A:
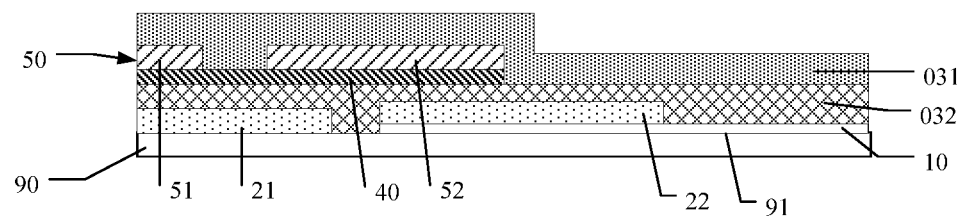
FIG. 7A and FIG. 7B are schematic diagrams of forming a first insulating layer and a second insulating layer in the manufacturing method for the pixel structure provided by at least one embodiment of the present disclosure.

Step S71: sequentially forming the second insulating material layer 032 and the first insulating material layer 031 covering the second insulating material layer 032 on the base substrate 90, as illustrated in FIG. 7A.

For example, the second insulating material layer 032 is formed before the active layer 40 and the source-drain electrode layer 50 are formed, and the first insulating material layer 031 is formed after the active layer 40 and the source-drain electrode layer 50 are formed.

Figure 7B:
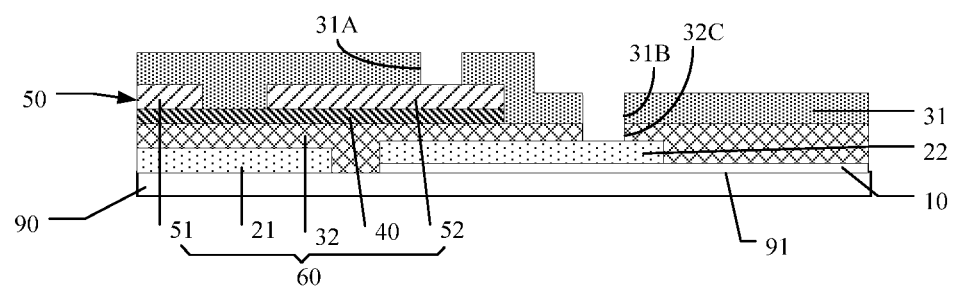

Step S72: performing a patterning process on the first insulating material layer 031 and the second insulating material layer 032 by using a same mask plate, so that the first insulating layer 31 provided with the first via hole 31A and the second via hole 31B and the second insulating layer 32 provided with the third via hole 32C are formed, as illustrated in FIG. 7B.

In the step S72, for example, the patterning process includes: forming a photoresist material on the first insulating material layer 031; exposing the photoresist material by using a mask plate; developing the photoresist material after exposure to obtain a photoresist pattern; then etching the first insulating material layer 031 and the second insulating material layer 032 by using the photoresist pattern as a mask, so that the first via hole 31A and the second via hole 31B are obtained by the etching process. For example, in the patterning process, the third via hole 32C is obtained by etching the second insulating material layer 032 with the photoresist pattern as the mask or with the second via hole 31B as the mask, thus an edge of the third via hole 32C and an edge of the second via hole 31B which are adjacent to each other are roughly aligned.

For example, after the steps S71 and S72 are completed, the photoresist pattern covering the first insulating layer 031 is removed.

For example, as illustrated in FIG. 2A to FIG. 2C, the pixel structure further includes the second connection pattern 22, the second connection pattern 22 is located between the first insulating layer 31 and the pixel electrode 10, and the first connection pattern 71 is electrically connected with the pixel electrode 10 by the second connection pattern 22 (for example, the second connection pattern 22 directly and electrically connects the first connection pattern 71 with the pixel electrode 10). In this case, for example, the manufacturing method provided by at least one embodiment of the present disclosure further includes the following steps S81 to S82.

For example, in the manufacturing method provided by at least one embodiment of the present disclosure, the second connection pattern 22 is manufactured by the following step S81 and step S82.

Figure 8A:
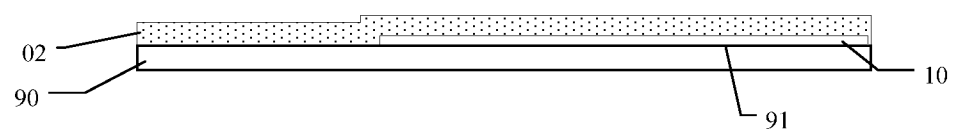
FIG. 8A and FIG. 8B are schematic diagrams of forming a second connection pattern and a gate electrode in the manufacturing method for the pixel structure provided by at least one embodiment of the present disclosure.

Step S81: after forming the pixel electrode 10 and before forming the first insulating layer 31, forming a gate electrode material layer (for example, a gate metal material layer) 02, as illustrated in FIG. 8A.

Figure 8B:
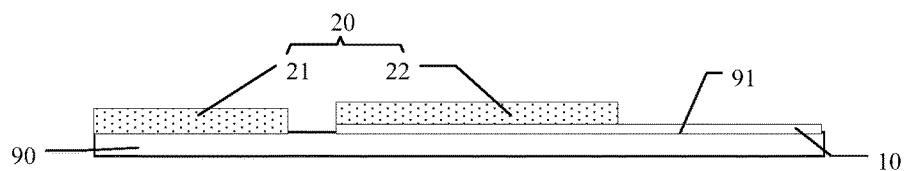

Step S82: performing a patterning process on the gate electrode material layer 02 to form a gate electrode layer (for example, a gate metal layer) 20, so that the gate electrode layer 20 includes the second connection pattern 22 and the gate electrode 21 spaced apart from each other, and the second connection pattern 22 is electrically connected with the pixel electrode 10, as illustrated in FIG. 8B.

In the step S82, for example, the patterning process includes: forming a photoresist material on the gate electrode material layer 02; exposing the photoresist material by using a mask plate; developing the photoresist material after exposure to obtain a photoresist pattern; then etching the gate electrode material layer 02 by using the photoresist pattern as a mask, so that the second connection pattern 22 and the gate electrode 21 are obtained by the etching process.

For example, the second connection pattern 22 overlaps the active layer 40. Because the second connection pattern 22 extends below the active layer 40, that is, the second connection pattern 22 extends to be between the active layer 40 and the base substrate 90, which not only increases a size of the second connection pattern 22 to further reduce the resistance, but also prevents the second connection pattern 22 from affecting the aperture ratio.

For example, as illustrated in FIG. 2B and FIG. 2C, the manufacturing method provided by at least one embodiment of the present disclosure further includes: forming the signal line 53, so that the signal line 53 is between the common electrode 72 and the base substrate 90, and the common electrode 72 overlaps the signal line 53. Because the common electrode 72 is located above the signal line 53 and the common electrode 72 overlaps the signal line 53, the common electrode 72 plays a role of shielding the signal of the signal line 53, and this allows a size of the effective region of the common electrode 72 to be made larger, which is conducive to increasing the aperture ratio and reducing power consumption.

For example, the signal line 53 is a data line, and the signal line 53 is electrically connected with the first electrode 51 of the thin film transistor 60 (the thin film transistor 60 includes the gate electrode 21, the active layer 40, the first electrode 51 and the second electrode 52) (for example, the signal line 53 is directly and electrically connected with the first electrode 51, that is, the source-drain electrode layer includes the data line, the first electrode 51 and the second electrode 52), as illustrated in FIG. 2B and FIG. 2C. In other embodiments, the signal line 53 is a gate line, for example, the signal line 53 is directly connected with the gate electrode, that is, the gate electrode layer includes the gate line and the gate electrode.

In the embodiments of the present disclosure, the active layer 40 and the source-drain electrode layer 50 are formed by using a gray-tone mask plate. Therefore, compared with the pixel structure shown in FIG. 1A which is made by using 6 mask plates, the pixel structure in the embodiments of the present disclosure is obtained by using 5 mask plates, so that the manufacturing cost of the pixel structure is reduced, and the aperture ratio of the pixel structure is higher.

For example, in the manufacturing method provided by at least one embodiment of the present disclosure, the pixel structure as illustrated in FIG. 2A to FIG. 2C is manufactured by 5 mask plates: forming the pixel electrode 10 by using a pixel electrode mask plate; forming the gate electrode layer 20 including the gate electrode 21 by using a gate mask plate; after forming the pixel electrode 10 and the gate electrode layer 20, forming the active layer 40 and the source-drain electrode layer 50 by using a source-drain layer mask plate; forming the first insulating material layer 031 and the second insulating material layer 032 between the first insulating material layer 031 and the base substrate 90, and patterning the first insulating material layer 031 and the second insulating material layer 032 by using an insulating layer mask plate to form the first insulating layer 31 including the first via hole 31A and the second via hole 3B and the second insulating layer 32 including the third via hole 32C, so that the second insulating layer 32 is located between the active layer 40 and the gate electrode layer 20, and the first insulating layer 31 is located between the source-drain electrode layer 50 and the common electrode 72; and after forming the first insulating layer 31 and the second insulating layer 32, forming a common electrode layer 70 including the first connection pattern 71 and the common electrode 72 by using a common electrode mask plate, so that the first connection pattern 71 is electrically connected with the second electrode 52 through the first via hole 31A, and the first connection pattern 71 is electrically connected with the pixel electrode 10 through the second via hole 31B and the third via hole 32C.

For example, the gate electrode layer 20 is formed after the pixel electrode 10 is formed, or the pixel electrode 10 is formed after the gate electrode layer 20 is formed. For example, in the case that the gate electrode layer 20 is formed after the pixel electrode 10 is formed, the gate electrode layer 20 further includes the second connection pattern 22 spaced apart from the gate electrode 21, the second connection pattern 22 is located on a side of the pixel electrode 10 away from the base substrate 90, and the second connection pattern 22 is electrically connected with the pixel electrode 10 and the first connection pattern 71.

Taking the pixel structure including the first connection pattern 71 and the second connection pattern 22 shown in FIG. 2A to FIG. 2C as an example, the manufacturing method using 5 mask plates provided by the embodiments of the disclosure is exemplified, which refers to the following step S91 to step S95.

Figure 9A:
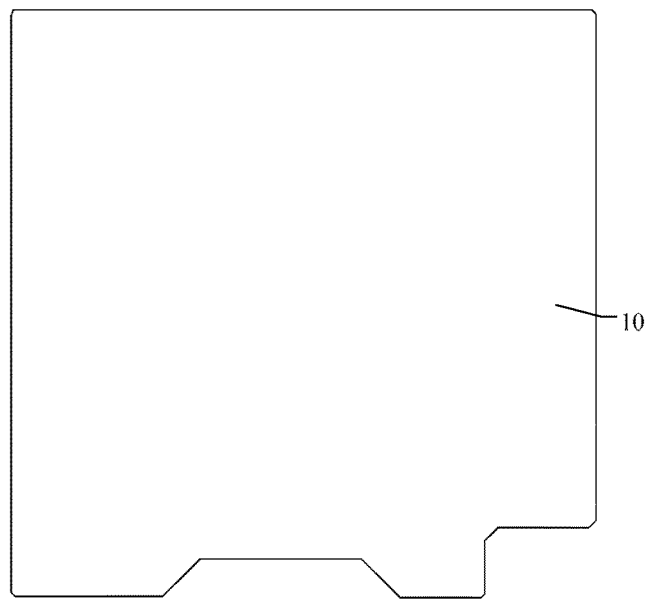
FIG. 9A to FIG. 9E are schematic diagrams of manufacturing the pixel structure as illustrated in FIG. 2A to FIG. 2C by using five mask plates in the manufacturing method for the pixel structure provided by at least one embodiment of the present disclosure.

Step S91: forming the pixel electrode 10 by using the pixel electrode mask plate, as illustrated in FIG. 9A.

Figure 9B:
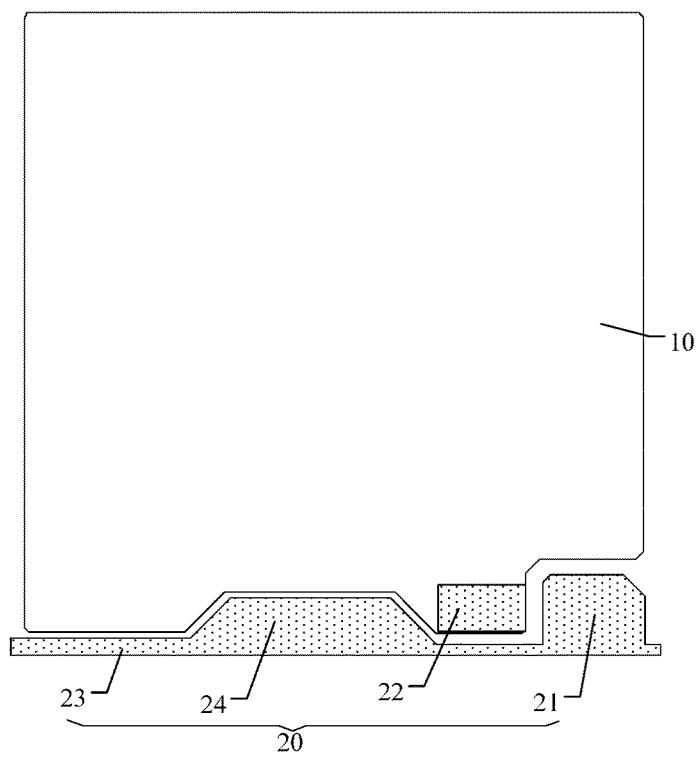

Step S92: forming the gate electrode layer 20 (such as the gate metal layer) including the gate electrode 21 and the second connection pattern 22 by using the gate mask plate, so that the second connection pattern 22 is electrically connected with the pixel electrode 10, as illustrated in FIG. 9B.

For example, as illustrated in FIG. 9B, the gate electrode layer 20 further includes the gate line 23, the gate line 23 is electrically connected with the gate electrode 21 (that is, the gate line 23 is directly and electrically connected with the gate electrode 21), and the gate line 23 is spaced apart from the second connection pattern 22. For example, the gate line 23 further includes a protruding portion 24 protruding toward the pixel electrode 10, and in a liquid crystal display device including the pixel structure, a spacer for maintaining a cell gap of a liquid crystal cell is provided in a region where the protruding portion 24 is located.

In the step S92, the manufacturing method of the gate electrode layer 20, for example, refers to step S81 and step S82 mentioned above, FIG. 8A and FIG. 8B.

Figure 9C:
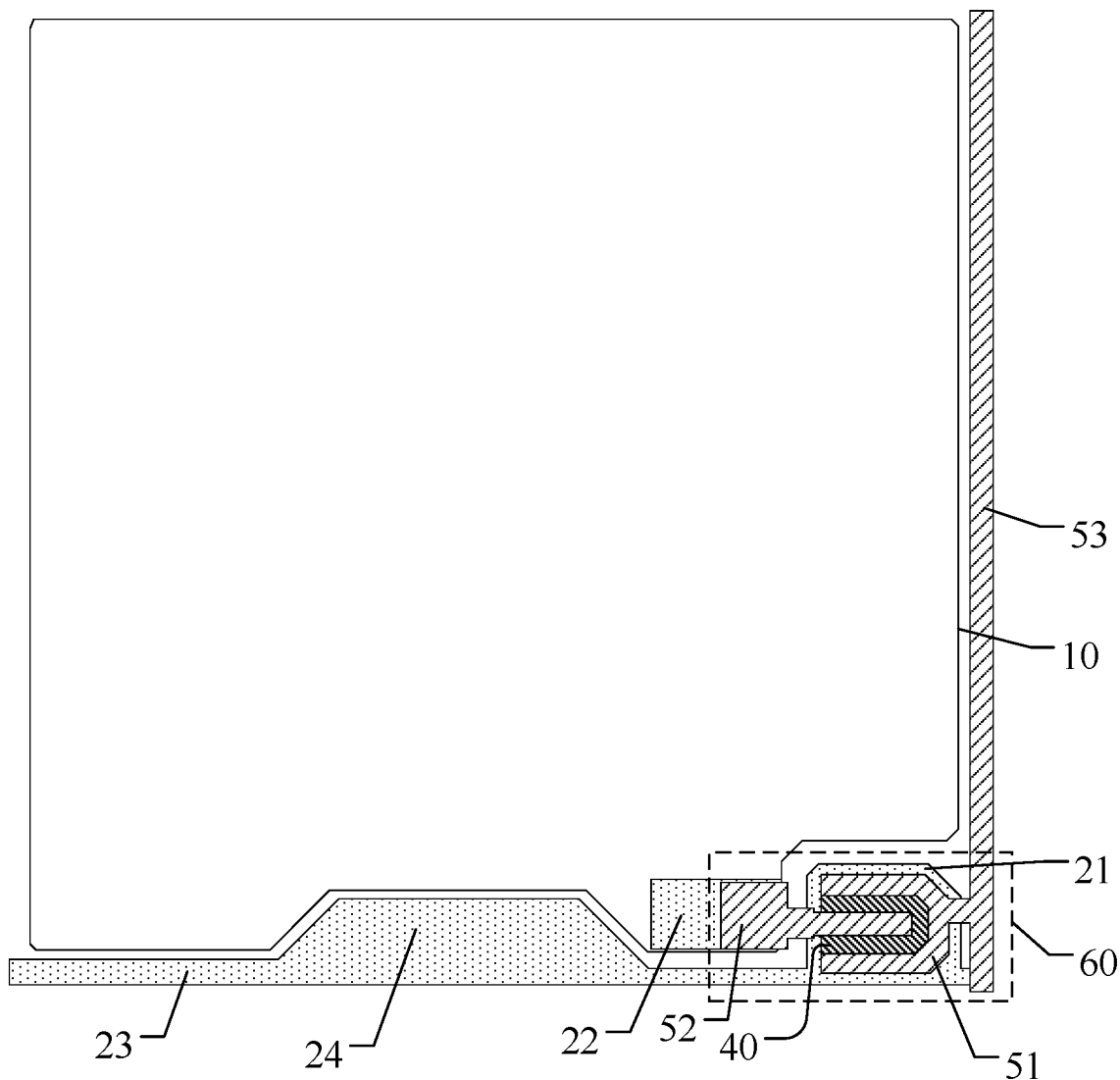

Step S93: forming the active layer 40 and the source-drain electrode layer including the first electrode 51, the second electrode 52 and the data line (an example of the signal line 53) by using the source-drain layer mask plate (such as the gray-scale mask plate), as illustrated in FIG. 9C.

In the step S93, for example, the manufacturing method of the active layer 40 and the source-drain electrode layer 50 refers to step S51 to step S54 mentioned above and FIG. 5A to FIG. 5D.

Figure 9D:
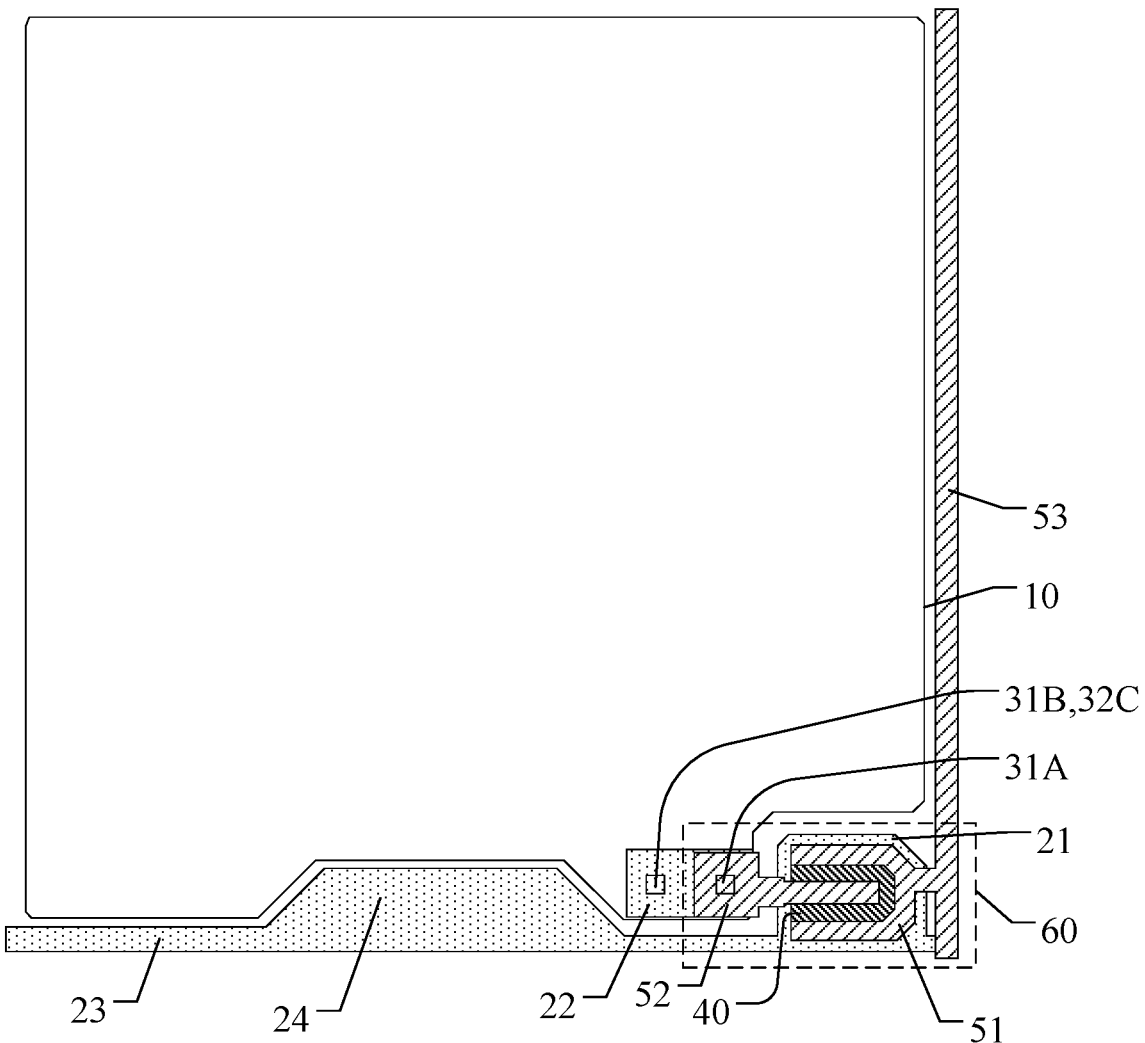

Step S94: forming the first insulating layer including the first via hole 31A and the second via hole 31B and the second insulating layer including the third via hole 32C by using an insulating layer mask plate, as illustrated in FIG. 9D.

In the step S94, for example, the manufacturing method of the first via hole 31A, the second via hole 31B and the third via hole 32C refers to step S71 to step S72 mentioned above, FIG. 7A and FIG. 7B.

Figure 9E:
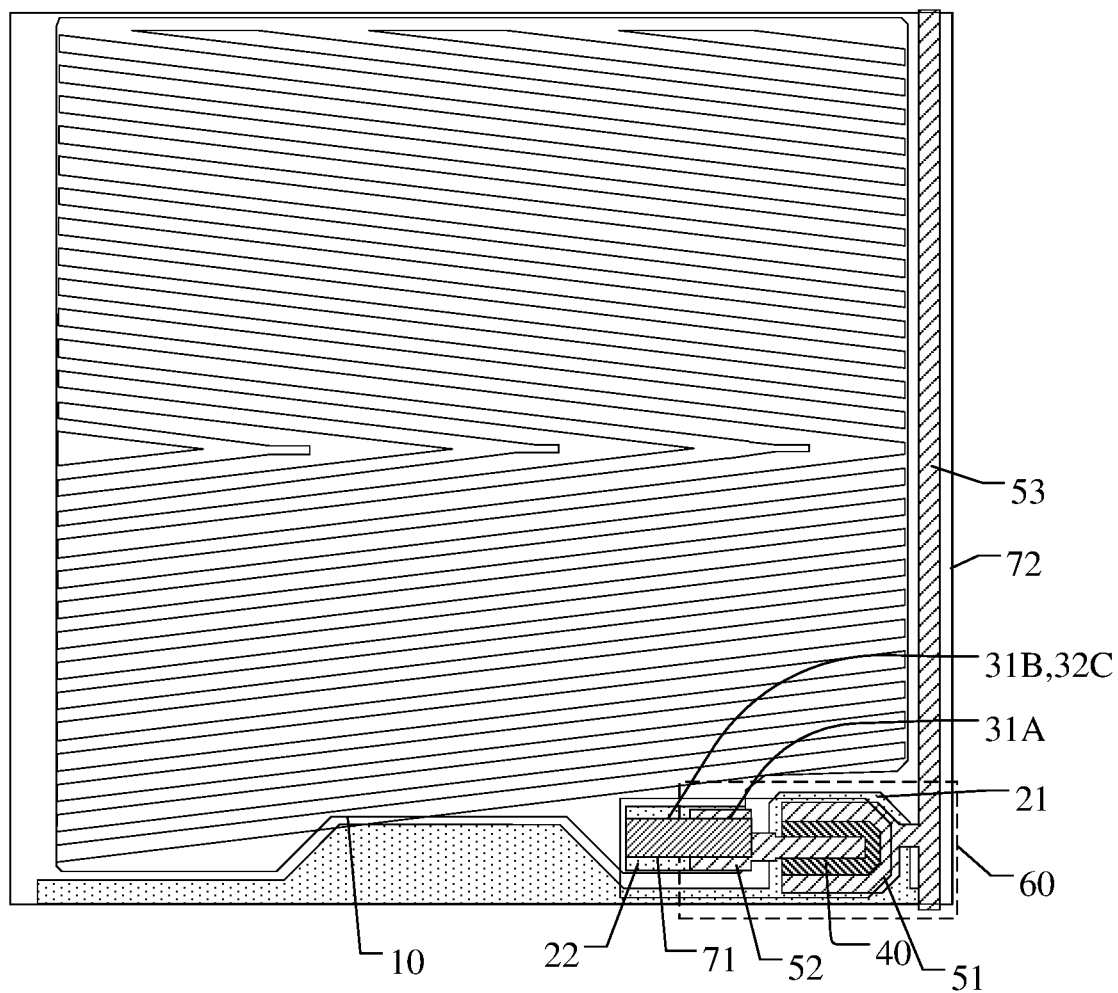

Step S95: forming the common electrode layer including the first connection pattern 71 and the common electrode 72 by using the common electrode mask plate, as illustrated in FIG. 9E.

For example, as illustrated in FIG. 9E, the common electrode 72 includes a plurality of strip sub-common electrodes spaced apart from each other.

In this step S94, for example, the manufacturing steps of the first connection pattern 71 and the common electrode 72 refer to step S61 and step S62 mentioned above and FIG. 6.

In the manufacturing method provided by the embodiments of the present disclosure, for example, the material of each of the first insulating layer 31 and the second insulating layer 32 is an inorganic insulating layer, an organic insulating layer or a laminated structure of the inorganic insulating layer and the organic insulating layer. For example, the material of each of the gate electrode 21, the first electrode 51 and the second electrode 52 is a conductive material such as a metal (such as aluminum, aluminum alloy, copper, copper alloy, titanium, titanium alloy, molybdenum or molybdenum-niobium alloy or the like) or a conductive plastic or the like. For example, the material of the active layer 40 is amorphous silicon, polysilicon, or a metal oxide semiconductor material or the like. For example, the material of each of the pixel electrode 10 and the common electrode 72 is a transparent conductive material, such as ITO (indium tin oxide), IZO (indium zinc oxide) or IGZO (indium gallium zinc oxide), or the like.

The embodiments of the present disclosure further provide a pixel structure, as illustrated in FIG. 2A to FIG. 2C. The pixel structure includes the base substrate 90 and includes the gate electrode layer 20, the pixel electrode 10, the active layer 40, the source-drain electrode layer 50 and the common electrode layer 70 which are located on the base substrate 90; the pixel electrode 10 is located between the base substrate 90 and the common electrode layer 70; the source-drain electrode layer 50 includes the first electrode 51 and the second electrode 52 which are electrically connected with the active layer 40; the common electrode layer 70 includes the common electrode 72 and the first connection pattern 71 disconnected from the common electrode 72, the first connection pattern 71 is located on a side of the second electrode 52 away from the base substrate 90 and the first connection pattern 71 is electrically connected with the second electrode 52; and the gate electrode layer 20 includes the gate electrode 21 and the second connection pattern 22 disconnected from the gate electrode 21, the second connection pattern 22 is located between the first connection pattern 71 and the pixel electrode 10, and the second connection pattern 22 is electrically connected with the first connection pattern 71 and the pixel electrode 10.

In the embodiments of the present disclosure, the second electrode 52 is electrically connected with the pixel electrode 10 by both the first connection pattern 71 and the second connection pattern 22. In this way, the source-drain electrode layer 50 and the active layer 40 are manufactured by using a same mask plate (such as a halftone mask plate), so that the process is saved and the cost is reduced. On the other hand, because the pixel electrode 10 is located between the common electrode 72 and the base substrate 90, as mentioned above, which is beneficial for improving the aperture ratio. Moreover, because both the first connection pattern and the second connection pattern are formed by using an original electrode layer of the pixel structure, no additional process is added.

For example, the pixel structure further includes the first insulating layer 31 and the second insulating layer 32 between the first insulating layer 31 and the base substrate 90; the pixel electrode 10, the active layer 40 and the source-drain electrode layer 50 are located between a layer where the first insulating layer 31 is located and the base substrate 90, the first insulating layer 31 is provided with the first via hole 31A and the second via hole 31B therein, the orthographic projection of the first via hole 31A on the base substrate 90 overlaps the orthographic projection of the second electrode 52 on the base substrate 90, and the orthographic projection of the second via hole 31B on the base substrate 90 overlaps the orthographic projection of the pixel electrode 10 on the base substrate 90; the second insulating layer 32 is provided with the third via hole 32C communicated with the second via hole 31B; the first connection pattern 71 is located on a side of the first insulating layer 31 away from the base substrate 90, the first connection pattern 71 is electrically connected with the second electrode 52 by the first via hole 31A and the first connection pattern 71 is electrically connected with the second connection pattern 22 by the second via hole 31B and the third via hole 32C.

For example, the second connection pattern 22 is in direct contact with the pixel electrode 10, that is, no insulating layer is provided between the second connection pattern 22 and the pixel electrode 10, sot that the process is saved. For example, the gate electrode layer 20 and the pixel electrode 10 are formed by using a same mask plate to simplify the process.

For example, the orthographic projection of the second connection pattern 22 on the base substrate 90 is located in the orthographic projection of the pixel electrode 10 on the base substrate 90.

For example, the orthographic projection of the second connection pattern 22 on the base substrate 90 is located outside the orthographic projection of the common electrode 72 on the base substrate 90 to avoid affecting the aperture ratio.

For example, the orthographic projection of the second connection pattern 22 on the base substrate 90 overlaps the orthographic projection of the active layer 40 on the base substrate 90. In this case, the second connection pattern 22 extends to be between the active layer 40 and the base substrate 90, which not only increases the size of the second connection pattern 22 to further reduce the resistance, but also avoids the influence of the second connection pattern 22 on the aperture ratio.

For example, the pixel structure further includes the signal line 53; in the direction perpendicular to the surface 91 of the base substrate 90, the signal line 53 is located between the common electrode 72 and the base substrate 90; as illustrated in FIG. 2C, the common electrode 72 overlaps the signal line 53, that is, the orthographic projection of the common electrode 72 on the base substrate 90 overlaps the orthographic projection of the signal line 53 on the base substrate 90. In the embodiments of the present disclosure, because the common electrode 72 is located above the signal line 53 and the common electrode 72 is overlapped with the signal line 53, the common electrode 72 shields the signal of the signal line 53, which makes the size of the effective region of the common electrode 72 (for example, the size of the portion which is included by the common electrode 72 and which is located in the opening region (that is, the display region) of the pixel structure) larger, so that the aperture ratio is improved and the power consumption is reduced.

For example, the signal line 53 is a data line, and the signal line 53 is electrically connected with the first electrode 51 of the thin film transistor 60 (for example, the signal line 53 is directly and electrically connected with the first electrode 51, that is, the source-drain electrode layer includes the data line, the first electrode 51 and the second electrode 52), as illustrated in FIG. 2B and FIG. 2C. In other embodiments, the signal line 53 is a gate line, for example, the signal line 53 directly connects the gate electrode, that is, the gate electrode layer includes the gate line and the gate electrode.

In the pixel structure, the manufacturing method of the pixel structure, the array substrate and the display device provided by the embodiments of the present disclosure, because the active layer and the source-drain electrode layer in the pixel structure are manufactured by the gray-tone mask process, the production cost is reduced and the production capacity is increased; because the pixel electrode is located at the lower side of the common electrode, it is beneficial to improve the aperture ratio.

Same components in the embodiments of the pixel structure and the manufacturing method of the pixel structure, the array substrate and the display device provided by the embodiments of the present disclosure are referred to each other. Without conflict, the embodiments of the present disclosure and the features in the embodiments may be combined with each other.

What are described above is related to only the illustrative embodiments of the present disclosure and not limitative to the protection scope of the present application. Therefore, the protection scope of the present application shall be defined by the accompanying claims.

What is claimed is:

1. A pixel structure, comprising a base substrate, and a pixel electrode, an active layer, a source-drain electrode layer, a common electrode, a black matrix, and a signal line which are on the base substrate, wherein:
   the pixel electrode is between the base substrate and the common electrode;
   the source-drain electrode layer comprises a first electrode and a second electrode which are electrically connected with the active layer, and the second electrode is electrically connected with the pixel electrode;
   the active layer is between the base substrate and the source-drain electrode layer, the active layer comprises a first surface close to the source-drain electrode layer, the source-drain electrode layer comprises a second surface close to the active layer, and a portion of an edge of the first surface of the active layer is aligned with a portion of an edge of the second surface of the source-drain electrode layer; and
   the black matrix is between adjacent pixel electrodes and has a width that is approximately equal to a distance between adjacent edges which respectively belong to the adjacent pixel electrodes, and the width of the black matrix is 12 µm; and
   the signal line is between the common electrode and the base substrate, wherein the signal line is electrically connected with the first electrode, the first electrode comprises two first end parts away from the signal line along a direction perpendicular to an extension direction of the signal line, and the active layer comprises a second end part away from the signal line along the direction perpendicular to the extension direction of the signal line, and an edge of each of the two first end parts is aligned with an edge of the second end part.

2. The pixel structure according to claim 1, further comprising:

a first insulating layer, wherein the pixel electrode, the active layer and the source-drain electrode layer are between a layer where the first insulating layer is located and the base substrate, a first via hole and a second via hole are in the first insulating layer, an orthographic projection of the first via hole on the base substrate overlaps an orthographic projection of the second electrode on the base substrate, and an orthographic projection of the second via hole on the base substrate overlaps an orthographic projection of the pixel electrode on the base substrate; and a first connection pattern, wherein the first connection pattern is on a side of the first insulating layer away from the base substrate, and the first connection pattern allows the second electrode to be electrically connected with the pixel electrode at least through the first via hole and the second via hole.

3. The pixel structure according to claim 2, further comprising a second insulating layer, wherein the second insulating layer is between the first insulating layer and the base substrate, and the second insulating layer covers the pixel electrode;

a third via hole communicated with the second via hole is in the second insulating layer, and the first connection pattern allows the second electrode to be electrically connected with the pixel electrode through the first via hole, the second via hole and the third via hole.

4. The pixel structure according to claim 2, further comprising a common electrode layer, and the common electrode layer comprises the first connection pattern and the common electrode.

5. The pixel structure according to claim 2, further comprising a second connection pattern, wherein the second connection pattern is between the first insulating layer and the pixel electrode, and the first connection pattern is electrically connected with the pixel electrode by the second connection pattern.

6. The pixel structure according to claim 5, further comprising a transistor, wherein the transistor comprises a gate electrode, the first electrode, the second electrode and the active layer, the pixel structure comprises a gate electrode layer, and the gate electrode layer comprises the second connection pattern and the gate electrode.

7. The pixel structure according to claim 5, wherein an orthographic projection of the second connection pattern on the base substrate overlaps an orthographic projection of the active layer on the base substrate.

8. The pixel structure according to claim 1, wherein an orthographic projection of the common electrode on the base substrate overlaps an orthographic projection of the signal line on the base substrate.

9. An array substrate, comprising the pixel structure according to claim 1.

10. A display device, comprising the array substrate according to claim 9.

11. A manufacturing method for a pixel structure, comprising:

forming a common electrode on a base substrate and a pixel electrode between the base substrate and the common electrode;

forming a source-drain electrode layer and an active layer on the base substrate by using a gray-tone mask process, wherein the active layer is between the base substrate and the source-drain electrode layer, the source-drain electrode layer comprises a first electrode and a second electrode which are electrically connected with the active layer, and the second electrode is electrically connected with the pixel electrode; and forming a black matrix between adjacent pixel structures, wherein the black matrix has a width that is approximately equal to a distance of adjacent edges which respectively belong to adjacent pixel electrodes, and the width of the black matrix is 12 μm;

forming a signal line between the common electrode and the base substrate, wherein the signal line is electrically connected with the first electrode, the first electrode comprises two first end parts away from the signal line along a direction perpendicular to an extension direction of the signal line, and the active layer comprises a second end part away from the signal line along the direction perpendicular to the extension direction of the signal line, and an edge of each of the two first end parts is aligned with an edge of the second end part.

12. The manufacturing method according to claim 11, wherein the forming the source-drain electrode layer and the active layer on the base substrate by using the gray-tone mask process comprises:

sequentially forming an active material layer, a source-drain material layer and a first photoresist pattern on the base substrate;

taking the first photoresist pattern as a mask to remove a portion which is comprised by the source-drain material layer and which is not covered by the first photoresist pattern to obtain a source-drain layer pattern, and removing a portion which is comprised by the active material layer and which is not covered by the first photoresist pattern to obtain the active layer;

processing the first photoresist pattern to obtain a second photoresist pattern; and taking the second photoresist pattern as a mask to remove a portion which is comprised by the source-drain layer pattern and which is not covered by the second photoresist pattern to obtain the source-drain electrode layer comprising the first electrode and the second electrode.

13. The manufacturing method according to claim 11, further comprising:

forming a first insulating material layer covering the pixel electrode, the active layer and the source-drain electrode layer;

patterning the first insulating material layer to form a first insulating layer, wherein a first via hole and a second via hole are formed in the first insulating layer, an orthographic projection of the first via hole on the base substrate overlaps an orthographic projection of the second electrode on the base substrate, and an orthographic projection of the second via hole on the base substrate overlaps an orthographic projection of the pixel electrode on the base substrate; and forming a first connection pattern on the first insulating layer, wherein the first connection pattern allows the second electrode to be electrically connected with the pixel electrode through at least the first via hole and the second via hole.

14. A pixel structure, comprising a base substrate, and a gate electrode layer, a pixel electrode, an active layer, a source-drain electrode layer, a common electrode layer, and a signal line which are on the base substrate, wherein the pixel electrode is between the base substrate and the common electrode layer;

the source-drain electrode layer comprises a first electrode and a second electrode which are electrically connected with the active layer;

the common electrode layer comprises a common electrode and a first connection pattern disconnected from the common electrode, the first connection pattern is on a side of the second electrode away from the base substrate, and the first connection pattern is electrically connected with the second electrode; and the gate electrode layer comprises a gate electrode and a second connection pattern disconnected from the gate electrode, the second connection pattern is between the first connection pattern and the pixel electrode, and the second connection pattern is electrically connected with the first connection pattern and the pixel electrode, wherein an orthographic projection of the second connection pattern on the base substrate is in an orthographic projection of the pixel electrode on the base substrate; and the signal line is between the common electrode and the base substrate, wherein the signal line is electrically connected with the first electrode; the first electrode comprises two first end parts away from the signal line along a direction perpendicular to an extension direction of the signal line, and the active layer comprises a second end part away from the signal line along the direction perpendicular to the extension direction of the signal line, and an edge of each of the two first end parts is aligned with an edge of the second end part.

15. The pixel structure according to claim 14, wherein the second connection pattern is in direct contact with the pixel electrode.

16. The pixel structure according to claim 14, wherein the orthographic projection of the second connection pattern on the base substrate is outside an orthographic projection of the common electrode on the base substrate.

17. The pixel structure according to claim 14, wherein the orthographic projection of the second connection pattern on the base substrate overlaps an orthographic projection of the active layer on the base substrate.

18. The pixel structure according to claim 14, further comprising: a first insulating layer and a second insulating layer between the first insulating layer and the base substrate, wherein the pixel electrode, the active layer and the source-drain electrode layer are between a layer where the first insulating layer is located and the base substrate, a first via hole and a second via hole are in the first insulating layer, an orthographic projection of the first via hole on the base substrate overlaps an orthographic projection of the second electrode on the base substrate, and an orthographic projection of the second via hole on the base substrate overlaps the orthographic projection of the pixel electrode on the base substrate;

a third via hole communicated with the second via hole is in the second insulating layer;

the first connection pattern is on a side of the first insulating layer away from the base substrate, the first connection pattern is electrically connected with the second electrode through the first via hole, and the first connection pattern is electrically connected with the second connection pattern through the second via hole and the third via hole.

19. The pixel structure according to claim 14, wherein an orthographic projection of the common electrode on the base substrate overlaps an orthographic projection of the signal line on the base substrate.

* * * * *